United States Patent
Cao et al.

(10) Patent No.: US 11,770,959 B2
(45) Date of Patent: Sep. 26, 2023

(54) PIXEL ARRAY, DISPLAY APPARATUS AND FINE METAL MASK

(71) Applicants: Chengdu BOE Optoelectronics Technology Co., Ltd., Sichuan (CN); BOE TECHNOLOGY GROUP CO., LTD., Beijing (CN)

(72) Inventors: Peng Cao, Beijing (CN); Wei Zhang, Beijing (CN); Yamin Yang, Beijing (CN); Jianchao Zhang, Beijing (CN); Guang Jin, Beijing (CN); Jinyu Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,898

(22) PCT Filed: Oct. 29, 2021

(86) PCT No.: PCT/CN2021/127312
§ 371 (c)(1),
(2) Date: Sep. 20, 2022

(87) PCT Pub. No.: WO2022/160827
PCT Pub. Date: Aug. 4, 2022

(65) Prior Publication Data
US 2023/0180565 A1 Jun. 8, 2023

(30) Foreign Application Priority Data
Feb. 1, 2021 (CN) .......................... 202110137139.0

(51) Int. Cl.
G09G 3/32 (2016.01)
H10K 59/35 (2023.01)
G09G 3/3208 (2016.01)

(52) U.S. Cl.
CPC ......... H10K 59/353 (2023.02); G09G 3/3208 (2013.01); H10K 59/352 (2023.02)

(58) Field of Classification Search
CPC .. H10K 59/353; H10K 59/352; G09G 3/3208; G09G 3/32; G09G 3/34; G09G 3/36
See application file for complete search history.

(56) References Cited

FOREIGN PATENT DOCUMENTS

| CN | 107086239 A | 8/2017 |
|---|---|---|
| CN | 112968040 A | 6/2021 |

(Continued)

*Primary Examiner* — Pegeman Karimi
(74) *Attorney, Agent, or Firm* — HOUTTEMAN LAW LLC

(57) ABSTRACT

A pixel array, a display apparatus and a fine metal mask are provided. The pixel array includes first basic pixel units in odd-numbered rows and second basic pixel units in even-numbered rows; each first basic pixel unit includes first, second and third sub-pixel groups sequentially in a row direction; each second basic pixel unit includes the third, first and second sub-pixel groups sequentially in the row direction; the first, second and third sub-pixel groups include two first, two second and two third sub-pixels in a column direction, respectively; the first, second and third sub-pixels have different colors; the first and second basic pixel units in the even-numbered and odd-numbered rows are aligned in the column direction, respectively; in the first and second basic pixel units in two adjacent rows, the third sub-pixel groups in the two rows are staggered with each other in the row direction.

20 Claims, 5 Drawing Sheets

(56) References Cited

FOREIGN PATENT DOCUMENTS

| | | |
|---|---|---|
| JP | 2009069325 A | 4/2009 |
| JP | 2009169070 A | 7/2009 |

(a)

(b)

(c)

(d)

(e)

(f)

PIXEL ARRAY, DISPLAY APPARATUS AND FINE METAL MASK

TECHNICAL FIELD

The present disclosure relates to the field of display technology, and in particular to a pixel array, a display apparatus and a fine metal mask.

BACKGROUND

In an OLED display apparatus in the prior art, a color-display screen displays images through pixel units. Generally, a pixel unit includes three different color sub-pixels of red (R), green (G) and blue (B), and color and brightness of the pixel (each pixel corresponds to one pixel unit) may be controlled by controlling sizes of three RGB sub-pixels in a pixel unit.

SUMMARY

The present disclosure provides a pixel array, a display apparatus and a fine metal mask.

The pixel array includes a plurality of first basic pixel units arranged in odd-numbered rows and a plurality of second basic pixel units arranged in even-numbered rows; wherein each of the first basic pixel units includes a first sub-pixel group, a second sub-pixel group, and a third sub-pixel group arranged sequentially in a row direction; each of the second basic pixel units includes the third sub-pixel group, the first sub-pixel group, and the second sub-pixel group arranged sequentially in the row direction; the first sub-pixel group includes two first sub-pixels arranged in a column direction; the second sub-pixel group includes two second sub-pixels arranged in the column direction; the third sub-pixel group includes two third sub-pixels arranged in the column direction; each first sub-pixel, each second sub-pixel and each third sub-pixel have different colors; wherein the first basic pixel units in the even-numbered rows are aligned in the column direction; the second basic pixel units in the odd-numbered rows are aligned in the column direction; light emitting layers of the two first sub-pixels in the first sub-pixel group are continuous, light emitting layers of the two second sub-pixels in the second sub-pixel group are continuous, and light emitting layers of the two third sub-pixels in the third sub-pixel group are continuous; and there is a distance D between a boundary of the first sub-pixel group away from the second sub-pixel group in the first basic pixel unit and a boundary of the third sub-pixel group away from the first sub-pixel group in the second basic pixel unit closest to the first basic pixel unit in an adjacent row in the row direction; the D is greater than or equal to zero and less than or equal to a sum of a width of the first sub-pixel group in the row direction, a width of the second sub-pixel group in the row direction and a distance between the first sub-pixel group and the second sub-pixel group in the row direction.

In one embodiment, the first sub-pixel group includes two first pixel driving circuits for respectively driving the two first sub-pixels in the first pixel group to emit light; the second sub-pixel group includes two second pixel driving circuits for respectively driving the two second sub-pixels in the second pixel group to emit light; and the third sub-pixel group includes two third pixel driving circuits for respectively driving the two third sub-pixels in the third pixel group to emit light.

In one embodiment, in the first basic pixel unit and the second basic pixel unit closest to each other in two adjacent rows, the third sub-pixel group in one row at least partially overlap the first sub-pixel group or the second sub-pixel group in the other row in the row direction; or the third sub-pixel group in one row is located between the first sub-pixel group and the second sub-pixel group in the other row in the row direction.

In one embodiment, in each of the first basic pixel units or each of the second basic pixel units, the two first sub-pixels in the first sub-pixel group, the two second sub-pixels in the second sub-pixel group, and the two third sub-pixels in the third sub-pixel group are arranged in two rows and three columns, and a height of each first sub-pixel in the column direction, a height of each second sub-pixel in the column direction and a height of each third sub-pixel in the column direction are equal to each other.

In one embodiment, a width of each first sub-pixel in the row direction is less than that of each second sub-pixel in the row direction, and a width of each second sub-pixel in the row direction is less than that of each third sub-pixel in the row direction.

In one embodiment, each second sub-pixel and one corresponding first sub-pixel and one corresponding third sub-pixel in an adjacent row closest to the second sub-pixel constitute one basic display unit, so that the plurality of first basic pixel units and the plurality of second basic pixel units constitute a plurality of basic display units.

In one embodiment, each first sub-pixel is a red sub-pixel, each second sub-pixel is a green sub-pixel, and each third sub-pixel is a blue sub-pixel; and a light emitting center of the basic display unit constituted of the first sub-pixel, the second sub-pixel and the third sub-pixel is close to the green sub-pixel on a line connecting a center of the red sub-pixel and a center of the green sub-pixel.

In one embodiment, the plurality of basic display units are arranged in rows and columns; and a distance between light emitting centers of any two adjacent basic display units in any one row in the plurality of rows of basic display units is constant.

In one embodiment, in any adjacent three basic display units in any one column in the plurality of columns of basic display units, the any adjacent three basic display units include a first basic display unit, a second basic display unit, and a third basic display unit, and a distance between light emitting centers of the first and second basic display units is different from that between light emitting centers of the second and third basic display units.

In one embodiment, a center of the third sub-pixel group in each second basic pixel unit in the even-numbered row is at a midpoint of a line connecting centers of the first sub-pixel group and the second sub-pixel group in the first basic pixel unit closest to the third sub-pixel group in the odd-numbered row adjacent to the even-numbered row in the row direction; a center of the second sub-pixel group in each second basic pixel unit in the even-numbered row is at a midpoint of a line connecting centers of the second sub-pixel group and the third sub-pixel group in the first basic pixel unit closest to the second sub-pixel group in the odd-numbered row adjacent to the even-numbered row in the row direction; and a center of the first sub-pixel group in each second basic pixel unit in the even-numbered row is at a midpoint of a line connecting centers of the second sub-pixel group and the third sub-pixel group in the first basic pixel unit closest to the first sub-pixel group in the odd-numbered row adjacent to the even-numbered row in the row direction.

In one embodiment, a perpendicular bisector of a line connecting centers of two adjacent first sub-pixels in the same row in the row direction extends through a plurality of first sub-pixels in the same column; a perpendicular bisector of a line connecting centers of two adjacent second sub-pixels in the same row in the row direction extends through a plurality of second sub-pixels in the same column; and a perpendicular bisector of a line connecting centers of two adjacent third sub-pixels in the same row in the row direction may extend through a plurality of third sub-pixels in the same column.

In one embodiment, D is equal to zero.

In one embodiment, each of the first sub-pixel, the second sub-pixel and the third sub-pixel is shaped as a quadrangle or polygon; an edge of any one first sub-pixel away from the other first sub-pixel in the two first sub-pixels in the first sub-pixel group includes at least one rounded chamfer or flat chamfer; an edge of any one second sub-pixel away from the other second sub-pixel in the two second sub-pixels in the second sub-pixel group includes at least one rounded chamfer or flat chamfer; and/or an edge of any one third sub-pixel away from the other third sub-pixel in the two third sub-pixels in the third sub-pixel group includes at least one rounded chamfer or flat chamfer.

The present disclosure further provides a display apparatus including a substrate and the above pixel array disposed on the substrate.

In one embodiment, the display apparatus further includes at least one spacer on the substrate; and each spacer of the at least one spacer is between the first basic pixel unit and the second basic pixel unit in two adjacent rows in the column direction.

In one embodiment, an orthographic projection of each spacer on the substrate is rectangular or polygonal.

In one embodiment, the third sub-pixel group in each second basic pixel unit in the even-numbered row is between the first sub-pixel group and the second sub-pixel group in the first basic pixel unit in the odd-numbered row adjacent to the even-numbered row in the row direction; the second sub-pixel group in each second basic pixel unit in the even-numbered row is between the first sub-pixel group and the third sub-pixel group in the first basic pixel unit in the odd-numbered row adjacent to the even-numbered row in the row direction; the first sub-pixel group in each second basic pixel unit in the even-numbered row is between the second sub-pixel group and the third sub-pixel group in the first basic pixel unit in the odd-numbered row adjacent to the even-numbered row in the row direction; and each spacer is among the first sub-pixel group and the second sub-pixel group in the first basic pixel unit, and the third sub-pixel group in the second basic pixel unit closest to the first sub-pixel group and the second sub-pixel group in the first basic pixel unit in an adjacent row.

In one embodiment, a perpendicular bisector of a line connecting centers of two adjacent first sub-pixels in the same row in the row direction extends through a plurality of first sub-pixels in the same column; a perpendicular bisector of a line connecting centers of two adjacent second sub-pixels in the same row in the row direction extends through a plurality of second sub-pixels in the same column; and a perpendicular bisector of a line connecting centers of two adjacent third sub-pixels in the same row in the row direction extends through a plurality of third sub-pixels in the same column.

In one embodiment, the distance D is equal to zero; the at least one spacer includes a plurality of spacers; and the plurality of spacers are arranged in an array of rows and columns.

In one embodiment, an orthographic projection of the at least one spacer on the substrate is rectangular or polygonal; one side of each of the plurality of spacers forms an acute angle with the row direction; and spacers in two adjacent rows are arranged mirror-symmetrically with respect to the first basic pixel unit or the second basic pixel unit in one row between the two rows.

In one embodiment, extending lines of two adjacent spacers in the same column of spacers intersect with each other.

The present disclosure also provides a fine metal mask, including a first sub-mask, a second sub-mask and a third sub-mask, wherein the first sub-mask includes first sub-pixel group openings arranged in an array of rows and columns, the first sub-pixel group openings in adjacent rows are staggered in the row direction, and the first sub-pixel group openings in adjacent columns are staggered in the column direction; the second sub-mask includes second sub-pixel group openings arranged in an array of rows and columns, the second sub-pixel group openings in adjacent rows are staggered in the row direction, and the second sub-pixel group openings in adjacent columns are staggered in the column direction; and the third sub-mask includes third group openings arranged in an array of rows and columns, the third sub-pixel group openings in adjacent rows are staggered in the row direction, and the third sub-pixel group openings in adjacent columns are staggered in the column direction.

In one embodiment, any one of the first sub-pixel group openings, the second sub-pixel group openings and the third pixel group openings is shaped as a quadrangle, at least one of inner corners of the quadrangle includes a rounded chamfer or a flat chamfer.

In one embodiment, the quadrangle includes first and second sides extending in the column direction and opposite to each other, and third and fourth sides extending in the row direction and opposite to each other; and circular arcs or straight lines are provided between the first side and the third side, between the first side and the fourth side, between the second side and the third side and between the second side and the fourth side, respectively.

DETAIL DESCRIPTION OF EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating a relative positional relationship, and when the absolute position of an object being described is changed, the relative positional relationship may be changed accordingly.

The OLED display apparatus gradually replaces a liquid crystal display and becomes a mainstream in the field of a mobile phone and wearing. In the prior art, full high definition (FHD) products each adopt a rendering (SPR) algorithm for sub-pixels, and the poor physical pixel density (PPI) may be compensated by the algorithm. However, there is still a need for an arrangement of sub-pixels with a high PPI that enables a full color display without the rendering algorithm for sub-pixels (real-time display).

Figure 1:
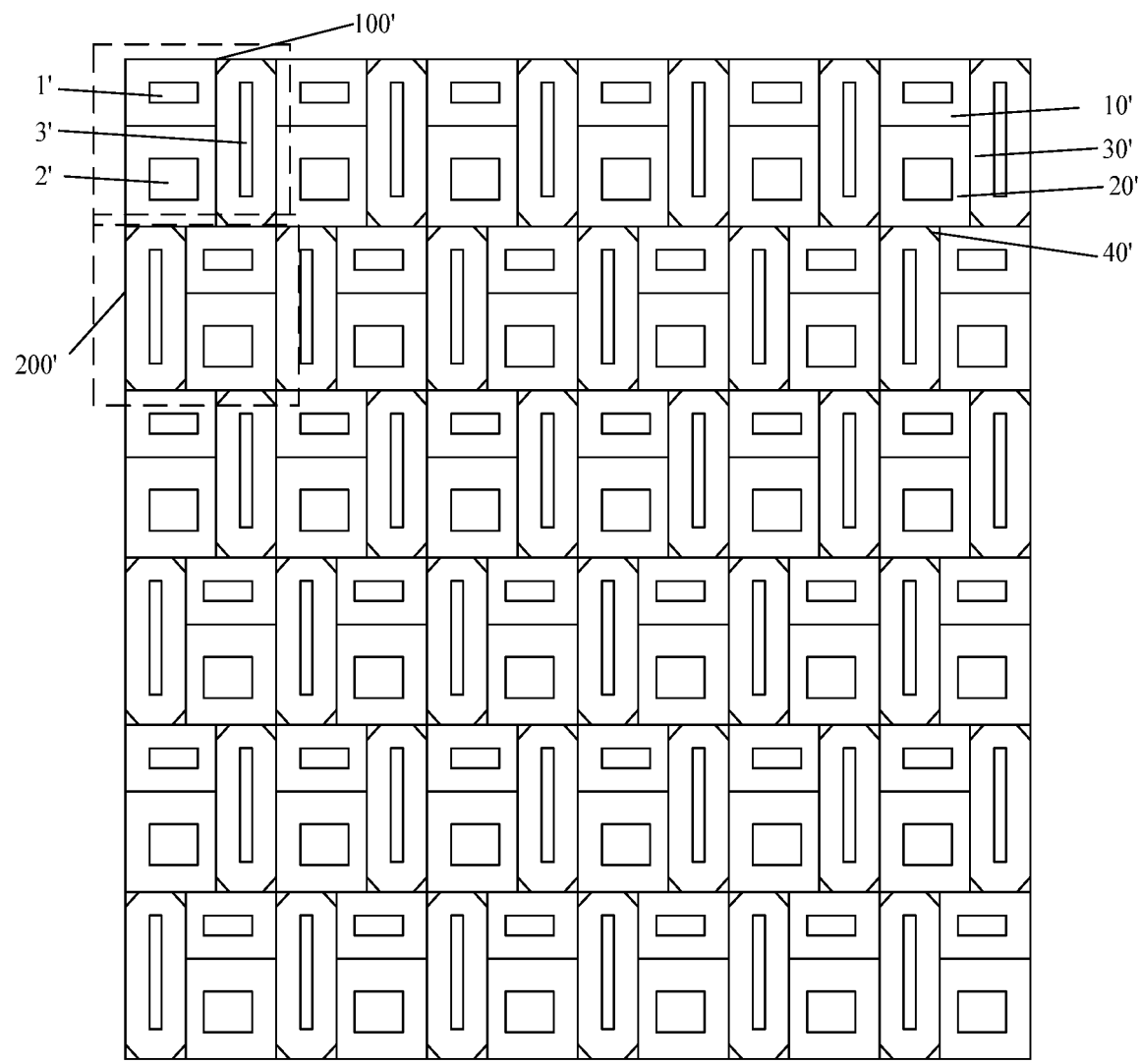
FIG. 1 is a schematic diagram showing a structure of a pixel array formed by RGB sub-pixels in the related art.

FIG. 1 shows a pixel array in a Delta arrangement in the related art. The pixel array includes a plurality of first pixel units 100' arranged in odd-numbered rows and a plurality of second pixel units 200' arranged in even-numbered rows; each first pixel unit 100' includes red and green sub-pixels 1' and 2' arranged in a column, and a blue sub-pixel 3' arranged side by side (arranged side by side in a row direction) with both the red and green sub-pixels 1' and 2'; each second pixel unit 200' includes a blue sub-pixel 3' and red and green sub-pixels 1' and 2' arranged in a column arranged side by side with the blue sub-pixel 3'; the plurality of first pixel units 100' are sequentially arranged along odd-numbered rows, and the plurality of second pixel units 200' are sequentially arranged along even-numbered rows. In the pixel array having such a structure, each of the first pixel units 100' and the second pixel units 200' includes three sub-pixels of different colors, which may form one basic display unit to realize the full color display. As shown in FIG. 1, in the pixel array with such a structure, the blue sub-pixel has a relatively narrow width of about 5 μm, which causes the color shift on the left and right. In addition, in the pixel array with such a structure, an opening (aperture) pitch of a fine metal mask (FMM for short) for evaporating the sub-pixels is relatively small, so that it is difficult to manufacture the FMM and it is also difficult to guarantee a profile angle (that is, an angle in a thickness direction when forming openings of the FMM).

To this end, the present disclosure proposes a new pixel array, including a plurality of first basic pixel units arranged in odd-numbered rows and a plurality of second basic pixel units arranged in even-numbered rows; each of the first basic pixel units includes a first sub-pixel group, a second sub-pixel group, and a third sub-pixel group arranged sequentially in a row direction; each of the second basic pixel units includes the third sub-pixel group, the first sub-pixel group, and the second sub-pixel group arranged sequentially in the row direction; the first sub-pixel group includes two first sub-pixels arranged in a column direction and spaced apart from each other; the second sub-pixel group includes two second sub-pixels arranged in the column direction and spaced apart from each other; the third sub-pixel group includes two third sub-pixels arranged in the column direction and spaced apart from each other; the first sub-pixel (for example, a red sub-pixel), the second sub-pixel (for example, a green sub-pixel) and the third sub-pixel (e.g., a blue sub-pixel) have different colors; the first basic pixel units in the even-numbered rows are aligned in the column direction; the second basic pixel units in the odd-numbered rows are aligned in the column direction; in the first basic pixel unit and the second basic pixel unit in two adjacent rows, the third sub-pixel group in one row is arranged to be staggered with the third sub-pixel group in the other row in the row direction.

Specifically, there is a distance D, in the row direction, between a boundary of the first sub-pixel group away from the second sub-pixel group in the first basic pixel unit and a boundary of the third sub-pixel group away from the first sub-pixel group in the second basic pixel unit closest to the first basic pixel unit in an adjacent row; the distance D is greater than or equal to zero and less than or equal to a sum of a width of the first sub-pixel group in the row direction, a width of the second sub-pixel group in the row direction and a distance between the first sub-pixel group and the second sub-pixel group in the row direction.

In the present disclosure, light emitting layers of two first sub-pixels in the first sub-pixel group are continuous, light emitting layers of two second sub-pixels in the second sub-pixel group are continuous, and light emitting layers of two third sub-pixels in the third sub-pixel group are continuous; and the two first sub-pixels in each first sub-pixel group are driven by different pixel driving circuits so that each first sub-pixel may independently emit light; the two second sub-pixels in each second sub-pixel group are driven by different pixel driving circuits so that each second sub-pixel may independently emit light; the two third sub-pixels in each third sub-pixel group are driven by different pixel driving circuits so that each third sub-pixel may emit light individually.

In the pixel array of the present disclosure, elongated sub-pixels (which may cause the color shift on the left and right) in the conventional technology may be avoided while realizing the real-time display (namely, the full color display may be realized without borrowing sub-pixels of adjacent pixel units and without a complex borrowing algorithm, so that the real-time display is realized), thereby increasing an aperture ratio. For example, the aperture ratio may be about 2 times of the aperture ratio in the conventional technology. In the pixel array of the present disclosure, sub-pixel groups of different colors (for example, a red sub-pixel group, a green sub-pixel group, and a blue sub-pixel group) are sequentially arranged in the same row, each sub-pixel group includes two sub-pixels arranged in a column direction, so that sub-pixels of different colors are sequentially arranged in the row direction. For example, the first basic pixel unit in the first row includes a first sub-row in which sub-pixels of different colors, for example, a red sub-pixel, a green sub-pixel, and a blue sub-pixel, are sequentially arranged, and a second sub-row in which sub-pixels of different colors, for example, a red sub-pixel, a green sub-pixel, and a blue sub-pixel, are also sequentially arranged; and the second row includes a third sub-row in which sub-pixels of different colors, for example, a blue sub-pixel, a red sub-pixel, and a green sub-pixel, are sequentially arranged, and a fourth sub-row in which sub-pixels of different colors, for example, a blue sub-pixel, a red sub-pixel, and a green sub-pixel, are sequentially arranged. The sub-pixel groups of different colors in the even-numbered rows are arranged in a same order, the sub-pixel groups of different colors in the odd-numbered are arranged in a same order, and the sub-pixels of different colors in the even-numbered rows and the odd-numbered are staggered with a predetermined distance such that in the first basic pixel unit and the second basic pixel unit in two adjacent rows, the third sub-pixel group in one row is arranged to be staggered with the third sub-pixel group in the other row in the row direction. For example, the blue sub-pixel group in one even-numbered row at least partially overlaps the red sub-pixel group and the green sub-pixel group closest to the blue sub-pixel group in an adjacent odd-numbered row in the row direction, or the blue sub-pixel group in one even-numbered row is located between the red sub-pixel group and the green sub-pixel group closest to the blue sub-pixel group in an adjacent odd-numbered row in the row direction, so as to easily combine the blue sub-pixels in the blue sub-pixel group with the red sub-pixels in the red sub-pixel group and the green sub-pixels in the green sub-pixel group closest to the blue sub-pixel group in the adjacent row, to form a basic display unit to achieve the full color display.

In such a pixel structure, the sub-pixel groups of different colors are sequentially arranged and the sub-pixel groups of different colors in two adjacent rows are staggered, so that the sub-pixels of different colors in the two adjacent rows may form a basic display unit to realize the full color display. In this way, a distance between two adjacent sub-pixels in the formed basic display unit is very short, the pixel density may be increased, and the borrowing algorithm is not needed, thereby realizing the real-time display. Based on this, each sub-pixel may be formed to have a greater width, and narrower sub-pixels in the prior art and as shown in FIG. 1 may not exist, so that the color shift on the left and right may be avoided, and the problems that a fine metal mask has small openings and is difficult to be formed may be solved.

Figure 2:
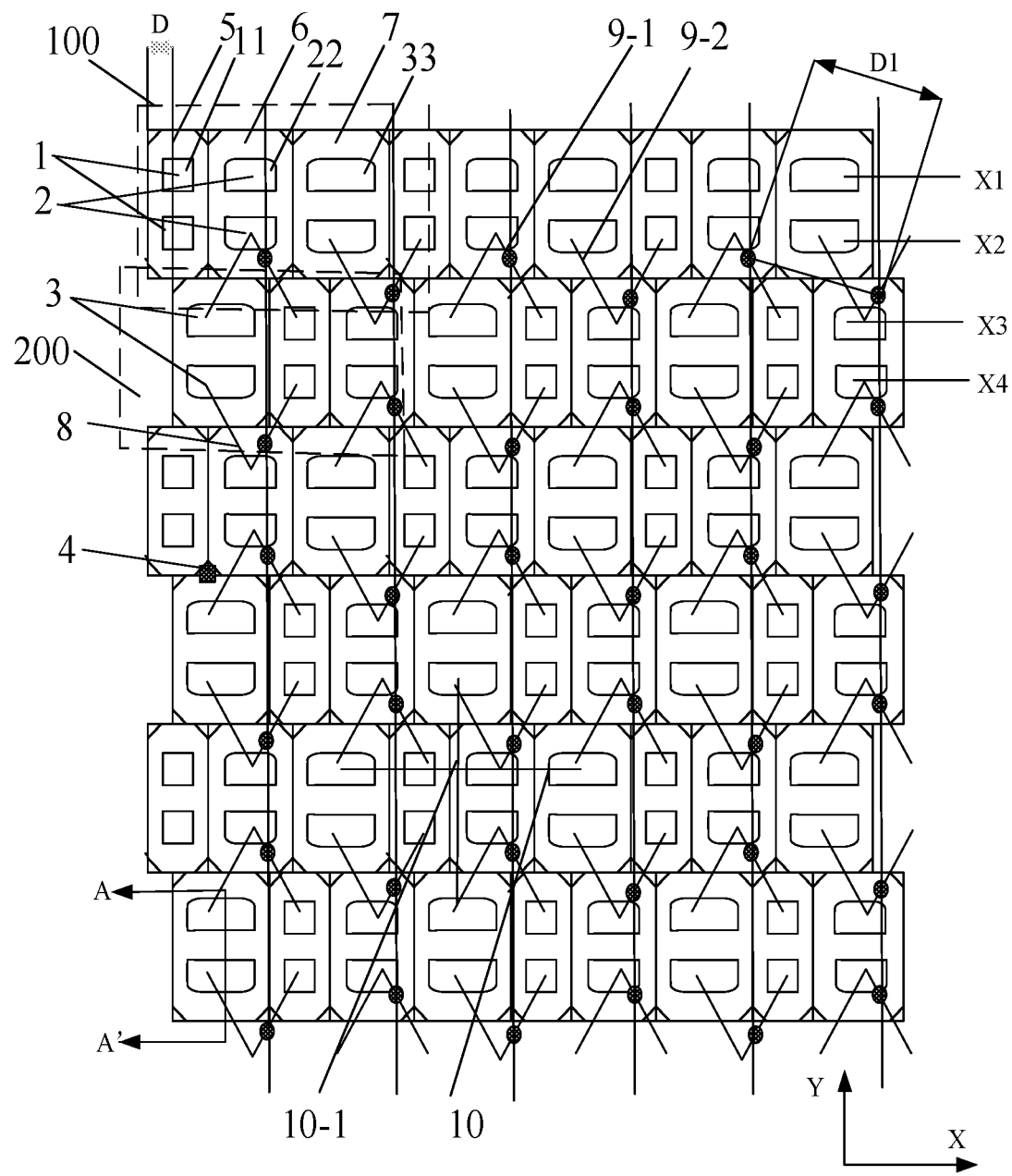
FIG. 2 shows a schematic diagram of a structure of a pixel array according to an embodiment of the present disclosure.

Specifically, as shown in FIG. 2, the pixel array of the present disclosure includes a plurality of first basic pixel units 100 arranged in odd-numbered rows and a plurality of second basic pixel units 200 arranged in even-numbered rows; each of the first basic pixel units 100 includes a first sub-pixel group 1, a second sub-pixel group 2, and a third sub-pixel group 3 arranged sequentially in a row direction X; each of the second basic pixel units 200 includes the third sub-pixel group 3, the first sub-pixel group 1, and the second sub-pixel group 2 arranged sequentially in the row direction X; the first sub-pixel group 1 includes two first sub-pixels 11 arranged in a column direction Y; the second sub-pixel group 2 includes two second sub-pixels 22 arranged in the column direction Y; the third sub-pixel group 3 includes two third sub-pixels 33 arranged in the column direction Y; the first sub-pixel 11 (for example, a red sub-pixel), the second sub-pixel 22 (for example, a green sub-pixel) and the third sub-pixel 33 (e.g., a blue sub-pixel) have different colors; the first basic pixel units 100 in the even-numbered rows are aligned in the column direction Y; the second basic pixel units 200 in the odd-numbered rows are aligned in the column direction Y; in the first basic pixel unit 100 and the second basic pixel unit 200 which are closest to each other in two adjacent rows, in the row direction, the third sub-pixel group 3 in one row is arranged to be staggered with the third sub-pixel group 3 in the other row closest to the third sub-pixel group 3 in the one row.

Based on the above staggered structure, in the present disclosure, the first sub-pixel groups 1, the second sub-pixel groups 2, and the third sub-pixel groups 3 in two adjacent rows are arranged in different orders.

For example, as shown in FIG. 2, in the first basic pixel unit 100 and the second basic pixel unit 200 in two adjacent rows, in the row direction X, the third sub-pixel group 3 in one row is arranged to at least partially overlap the first sub-pixel group 1 or the second sub-pixel group 2 in the other row closest to the third sub-pixel group 3 in the one row. In one embodiment, in the first basic pixel unit 100 and the second basic pixel unit 200 in two adjacent rows, in the row direction X, the third sub-pixel group 3 in one row is arranged between the first and second sub-pixel groups 1 and 2 in the other row closest to the third sub-pixel group 3 in the one row.

In the embodiment shown in FIG. 2, the first basic pixel units 100 in a first row are arranged sequentially in the row direction, and the first basic pixel units 100 in each of other odd-numbered rows (a third row, a fifth row, etc.) are arranged in the same manner as the first basic pixel units 100 in the first row. That is, in the column direction Y, the first basic pixel units 100 in the odd-numbered rows are aligned; the second basic pixel units 200 in a second row are sequentially arranged in the row direction, and the second basic pixel units 200 in each of other even-numbered rows (a fourth row, a sixth row, etc.) are arranged in the same manner as the second basic pixel units 200 in the second row. That is, in the column direction Y, the second basic pixel units 200 in the even-numbered rows are aligned.

FIG. 2 illustrates only one embodiment of the present disclosure, but the present disclosure is not limited thereto. In a specific arrangement, if the first basic pixel units 100 are sequentially arranged in the odd-numbered rows, the second basic pixel units 200 are sequentially arranged in the even-numbered rows; if the second basic pixel unit 200 is sequentially disposed in the odd-numbered rows, the first basic pixel unit 100 is sequentially disposed in the even-numbered rows, which, in practical applications, may be flexibly set according to a length-width ratio, a length, a width or other practical conditions of the display panel.

In the embodiment shown in FIG. 2, in each of the first basic pixel unit 100 and the second basic pixel unit 200, the two first sub-pixels 11 in the first sub-pixel group 1, the two second sub-pixels 22 in the second sub-pixel group 2, and the two third sub-pixels 33 in the third sub-pixel group 3 are arranged in two rows and three columns, and the heights of the first sub-pixels 11, the second sub-pixels 22, and the third sub-pixels 33 in the column direction Y may be equal to each other. That is, in the embodiment of FIG. 2, each sub-pixel group includes two identical sub-pixels. The first basic pixel unit in one row may be considered to include sub-pixels in two sub-rows (a first sub-row X1 and a second sub-row X2), the sub-pixels in the first sub-row X1 or the second sub-row X2 include a first sub-pixel 11, a second sub-pixel 22, and a third sub-pixel 33 arranged sequentially, and the second basic pixel unit in one row may be considered to include sub-pixels in two sub-rows (a third sub-row X3 and a fourth sub-row X4), and the sub-pixels of the third sub-row X3 or the fourth sub-row X4 include a third sub-pixel 33, a first sub-pixel 11, and a second sub-pixel 22 arranged sequentially.

In the present disclosure, the first sub-pixel group 1 may be formed by one opening in a fine metal mask, that is, light emitting layers of two first sub-pixels in one first sub-pixel group may be simultaneously formed by one step of depositing a light emitting layer, so that the light emitting layers of the two first sub-pixels are continuous. In this case, a size of each first sub-pixel opening in the first sub-pixel group may be defined, for example, by an opening formed in a pixel defining layer, and each first sub-pixel may include, for example, a discrete anode and an individual pixel driving circuit, so that each first sub-pixel may be individually controlled to emit light based on the individual pixel driving circuit.

Similarly, the second sub-pixel group 2 may be formed by one opening in a fine metal mask. That is, light emitting layers of two second sub-pixels in one second sub-pixel group may be simultaneously formed by one step of depositing a light emitting layer, so that the light emitting layers of the two second sub-pixels are continuous. In this case, a size of each second sub-pixel opening in the second sub-pixel group may be defined, for example, by an opening formed in a pixel defining layer, and each second sub-pixel may include, for example, a discrete anode and an individual pixel driving circuit, so that each second sub-pixel may be individually controlled to emit light based on the individual pixel driving circuit.

Figure 3:
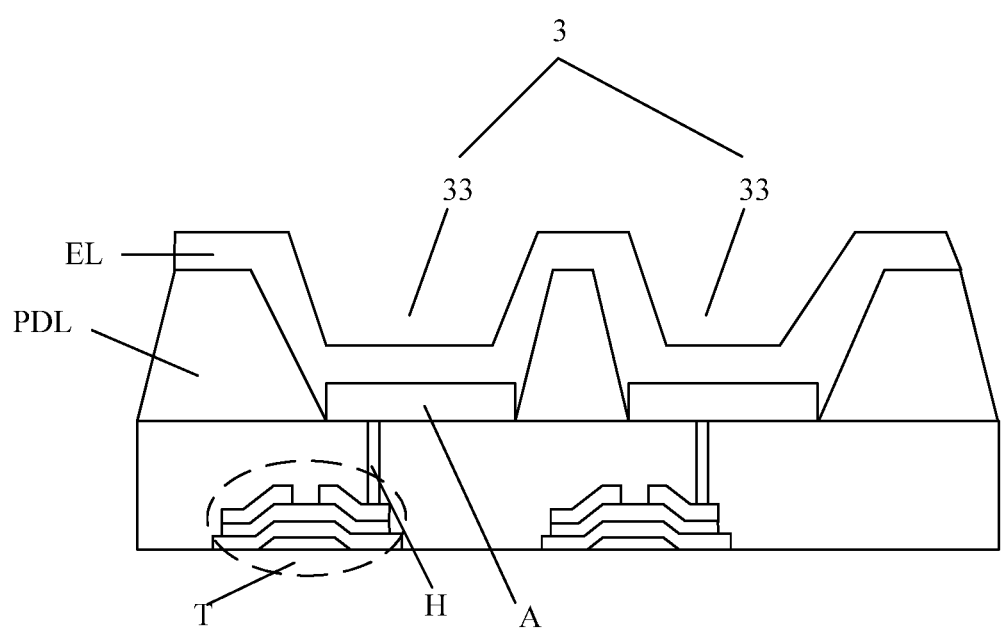
FIG. 3 shows a schematic cross-sectional view of a third sub-pixel group of a pixel array according to an embodiment of the present disclosure.

Specifically, for example, FIG. 3 shows a schematic sectional view of the structure of the third sub-pixel group 3 taken along a line AA' shown in FIG. 2. Similar to the first sub-pixel group 1 and the second sub-pixel group 2, the third sub-pixel group 3 may also be formed by one opening in a fine metal mask, that is, light emitting layers EL of two third sub-pixels 33 in one third sub-pixel group 3 may be simultaneously formed by one step of depositing a light emitting layer EL, so that the light emitting layers EL of the two third sub-pixels 33 are continuous. In this case, a size of an opening of each third sub-pixel 33 in the third sub-pixel group 3 may be defined, for example, by an opening formed in a pixel defining layer PDL, and each third sub-pixel 33 may include, for example, a discrete anode A and a separate pixel driving circuit T, so that a light emission of each third sub-pixel 33 may be individually controlled by the separate pixel driving circuit T via a conductive material in a via A.

Further, as shown in FIG. 2, a width of the first sub-pixel 11 in the row direction X may be less than a width of the second sub-pixel 22 in the row direction X, and the width of the second sub-pixel 22 in the row direction X is less than a width of the third sub-pixel 33 in the row direction X. For example, when the first sub-pixel 11 is a red sub-pixel, the second sub-pixel 22 is a green sub-pixel, and the third sub-pixel 33 is a blue sub-pixel, the above widths may ensure that the light emitting devices of the colors may compensate for (prolong) the life of the light emitting layers of the sub-pixels of the different colors. In particular, for example, for an organic electroluminescent display device, compared to red and green light emitting materials, a blue light emitting material generally has the lowest light emitting efficiency and the shortest life, and thus, an area of a blue sub-pixel may be greater than that of each of red and green sub-pixels. In the embodiment of the present disclosure, as shown in FIG. 2, in order to achieve a uniform light emission, heights of the sub-pixels may be set to be equal to each other, and widths of the sub-pixels may be set to be different from each other, so that the sub-pixels of different colors may have different areas, so as to improve the life of the display apparatus.

As shown in FIG. 2, each of the sub-pixel groups in the first basic pixel units 100 in the odd-numbered rows includes two sub-pixels arranged in the column direction, and each of the pixel groups in the second basic pixel units 200 in the even-numbered rows includes two sub-pixels arranged in the column direction. Therefore, as described above, each odd-numbered row includes two rows of the first sub-pixels 11, the second sub-pixels 22, and the third sub-pixels 33 arranged in the same order, and each even-numbered row includes two rows of the third sub-pixels 33, the first sub-pixels 11, and the second sub-pixels 22 arranged in the same order. Based on this configuration, each second sub-pixel 22 forms one basic display unit together with a first sub-pixel 11 and a third sub-pixel 33 in an adjacent row and closest to the second sub-pixel 22, so that the plurality of first basic pixel units 100 and the plurality of second basic pixel units 200 form a plurality of basic display units.

As shown in FIG. 2, the plurality of basic display units includes a first basic display unit 9-1 and a second basic display unit 9-2. The second sub-pixel 22 serves as a vertex of a triangle, and a line connecting the first sub-pixel 11 and the third sub-pixel 33 serves as a base of the triangle, so that the first basic display unit 9-1 and the second basic display unit 9-2 may be regarded as two triangles with the vertices facing different directions. The first basic display unit 9-1 includes a second sub-pixel 22 in one row and a first sub-pixel 11 and a third sub-pixel 33 in the next adjacent row and closest to the second sub-pixel 22.

The sub-pixels of different colors in two adjacent rows in the pixel array with this configuration form one basic display unit for realizing the full color display, so that the real-time full color display may be realized without borrowing sub-pixels between pixel units. In the pixel array of the present disclosure, the arrangement of the sub-pixels is changed, so that the aperture ratio of pixels is improved, the sub-pixels with elongated openings in the related art are avoided, and the PPI is increased, so that a physical resolution of a display apparatus including the pixel array may be improved, the image display of different colors is realized, and the good color uniformity is obtained; accordingly, a size and pitch of the openings of the sub-pixels may also be easily set and changed to meet the desired display requirements.

In the embodiment of the present disclosure, basic colors of the first sub-pixel, the second sub-pixel, and the third sub-pixel may constitute three primary colors for realizing the full color display. The basic color refers to the color of the sub-pixel structure itself, which may realize the color display. For the pixel structure in the organic electroluminescent display apparatus, the basic color refers to a color of a light emitting layer in an organic electroluminescent diode, i.e., the corresponding color of the light emitted by the light emitting layer under a normal pressurized state. Typically, the base colors include red, green, and blue colors. In this embodiment, the basic color in the sub-pixel may be any one of three primary colors, i.e., red, green and blue colors.

When the first sub-pixel 11 is a red sub-pixel, the second sub-pixel 22 is a green sub-pixel, and the third sub-pixel 33 is a blue sub-pixel, the plurality of first basic display units 9-1 and the plurality of second basic display units 9-2 may emit white light. A light emitting center (such as a white light center) 8 of each of the plurality of elementary display units is located close to the green sub-pixel and on a line connecting a center of the red sub-pixel and a center of the green sub-pixel. For example, according to actual requirements, the light emitting center 8 may be located at a position close to the green sub-pixel on the line connecting the center of the red sub-pixel and the center of the green sub-pixel, with a distance between the position and the green sub-pixel being ⅓ of a distance between the position and the red sub-pixel.

As shown in FIG. 2, the plurality of light emitting centers of the plurality of basic display units may be arranged in rows and columns, a distance between the light emitting centers of any two adjacent basic display units in any one row of basic display units is constant. As shown in FIG. 2, a distance D1 between the light emitting centers of any two adjacent basic display units in one row of basic display units formed by the second sub-row X2 and the third sub-row X3 is constant. As shown in FIG. 2, the light emitting center of the first basic display unit 9-1 is closer to the green sub-pixel of the first basic display unit 9-1 and the light emitting center of the adjacent second basic display unit 9-2 is closer to the green sub-pixel of the second basic display unit 9-2, so that a distance between the light emitting centers of the two adjacent first basic display units 9-1 in a same column is greater than the distance between the light emitting centers of the two adjacent second basic display units 9-2 in a same column in the basic display units in two adjacent rows. That is, the four light emitting centers of the four basic display units in the two adjacent columns and the two adjacent rows may constitute one isosceles trapezoid.

With this configuration, the plurality of light emitting centers 8 are symmetrically arranged with respect to a column of light emitting centers 8 as a symmetry axis in the entire pixel array (or may have a mirror symmetry about the column of light emitting centers 8 as a symmetry axis). With this configuration, it may realize a more uniform light emission, ensure a uniformity of display effect, and realize high-quality picture display.

In addition, the arrangement of the sub-pixels in the pixel array of the present application is not limited to that shown in FIG. 2. For example, a center of the third sub-pixel group 3 in each second basic pixel unit 200 in the even-numbered row may be located in the middle of a line connecting centers of the first sub-pixel group 1 and the second sub-pixel group 2 in the first basic pixel unit 100 closest to the third sub-pixel group 3 in an adjacent odd-numbered row in the row direction; a center of the second sub-pixel group 2 in each second basic pixel unit 200 in the even-numbered row may be located at a midpoint of a line connecting centers of the second sub-pixel group 2 and the third sub-pixel group 3 in the first basic pixel unit 100 closest to the second sub-pixel group 2 in an adjacent odd-numbered row in the row direction; and a center of the first sub-pixel group 1 in each second basic pixel unit 200 in the even-numbered row may be located at a midpoint of a line connecting centers of the second sub-pixel group 2 and the third sub-pixel group 3 in the first basic pixel unit 100 closest to the first sub-pixel group 1 in an adjacent odd-numbered row in the row direction, which depends on the actual application of the display apparatus including the pixel array.

In addition, as shown in FIG. 2, a perpendicular bisector 10-1 of a line 10 connecting centers of two adjacent third sub-pixels 33 in the same row in the row direction may extend through a plurality of third sub-pixels 33 in the same column. A similar configuration is possible for the first sub-pixel 11 and the second sub-pixel 22, that is, a perpendicular bisector of a line connecting centers of two adjacent first sub-pixels 11 in the same row in the row direction extends through a plurality of first sub-pixels 11 in the same column; a perpendicular bisector of a line connecting centers of two adjacent second sub-pixels 22 in the same row in the row direction extends through a plurality of second sub-pixels 22 in the same column.

Figure 4:
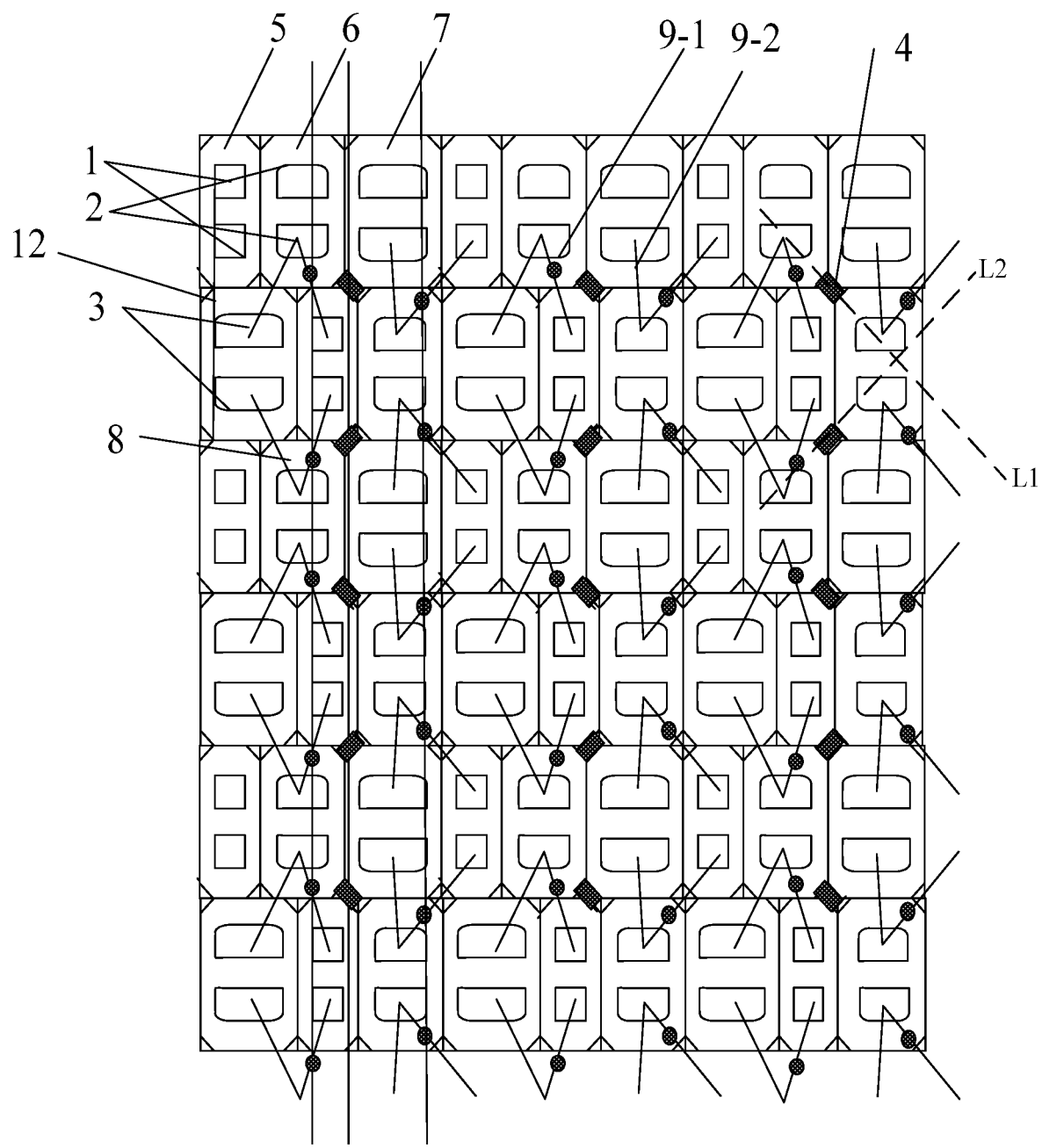
FIG. 4 shows a schematic diagram of a structure of a pixel array according to an embodiment of the present disclosure.

Unlike the embodiment shown in FIG. 2, D is equal to zero in the embodiment shown in FIG. 4. That is, the plurality of first basic pixel units 100 and the plurality of second basic pixel units 200 are aligned in the column direction; in the first and second basic pixel units 100 and 200 adjacent to each other in two adjacent rows and in the same column, an outer edge of the first sub-pixel 11 of the first basic pixel unit 100 is aligned with that of the third sub-pixel 33 of the second basic pixel unit 200 in the column direction. Similar to the pixel array shown in FIG. 2, the sub-pixel arrangement in the odd-numbered rows of the pixel array shown in FIG. 4 is different from that in the even-numbered rows. For example, in the embodiment shown in FIG. 4, the pixel array includes the plurality of first basic pixel units 100 arranged in the odd-numbered rows and the plurality of second basic pixel units 200 arranged in the even-numbered rows, each first basic pixel unit 100 includes the first sub-pixel group 1, the second sub-pixel group 2, and the third sub-pixel group 3 arranged sequentially in the row direction X, each second basic pixel unit 200 includes the third sub-pixel group 3, the first sub-pixel group 1, and the second sub-pixel group 2 arranged sequentially in the row direction X, the first sub-pixel group 1 includes two first sub-pixels 11 arranged in the column direction Y, the second sub-pixel group 2 includes two second sub-pixels 22 arranged in the column direction Y, the third sub-pixel group 3 includes two third sub-pixels 33 arranged in the column direction Y, the first sub-pixel 11 (e.g., the red sub-pixel), the second sub-pixel 22 (e.g., the green sub-pixel), and the third sub-pixel 33 (e.g., the blue sub-pixel) have different colors; the first basic pixel units 100 in the even-numbered rows are aligned in the column direction Y; the second basic pixel units 200 of the odd-numbered rows are aligned in the column direction Y. In this embodiment, in the pixel units in two adjacent rows, the first sub-pixel 11 of the first basic pixel unit 100 in one row is aligned with the third sub-pixel 33 of the second basic pixel unit 200 closest to the first sub-pixel 11 in the other row. In this configuration, the first and second basic pixel units 100 and 200 in two adjacent rows are aligned in the column direction, but the sub-pixels of a same color in the first and second basic pixel units 100 and 200 are not aligned with each other, so that the first and second basic pixel units 100 and 200 closes to each other in two adjacent rows may constitute a basic display unit for realizing the full color display, as shown in FIG. 4, so that the plurality of first and second basic pixel units 100 and 200 constitute a plurality of basic display units. As shown in FIG. 4, the plurality of basic display units are arranged in rows and columns. Similar to FIG. 2, the pixel array shown in FIG. 4 also includes the plurality of first basic display units 9-1 and the plurality of second basic display units 9-2.

When the first sub-pixel 11 is a red sub-pixel, the second sub-pixel 22 is a green sub-pixel, and the third sub-pixel 33 is a blue sub-pixel, the plurality of basic display units may include the plurality of white display units, for example; a light emitting center 8 of each of the plurality of basic display units is located close to the green sub-pixel on a line connecting the center of the red sub-pixel and the center of the green sub-pixel.

As shown in FIG. 4, the plurality of basic display units may be arranged in rows and columns, and a distance between two light emitting centers of any two adjacent basic display units in any two adjacent rows may be constant. In one embodiment, similar to the embodiment shown in FIG. 2, the four light emitting centers 8 of the four basic display units in the two adjacent rows and the two adjacent columns may form an isosceles trapezoid.

With this configuration, the plurality of light emitting centers 8 are symmetrically arranged with respect to a column of light emitting centers 8 as a symmetry axis in the entire pixel array (or may have a mirror symmetry about the column of light emitting centers 8 as a symmetry axis), so that a more uniform light emission may be achieved.

As shown in FIGS. 2 and 4, the first sub-pixel 11, the second sub-pixel 22, and the third sub-pixel 33 are each quadrangular. For example, a shape of any one of the two first sub-pixels 11 in the first sub-pixel group 1 may be a square or a rectangle with four corners being right angles; an edge of one of the two second sub-pixels 22 in the second sub-pixel group 2 away from the other second sub-pixel 22 may include at least one rounded or flat chamfer; and an edge of one of the two third sub-pixels 33 in the third sub-pixel group 3 away from the other third sub-pixel 33 may include at least one rounded or flat chamfer.

The present disclosure is not limited thereto. Specifically, a shape of each of the first sub-pixel 11, the second sub-pixel 22 and the third sub-pixel 33 may be any one or more or a combination of a circle, a triangle, a pentagon, a hexagon or an octagon. For example, the first sub-pixel 11, the second sub-pixel 22 and the third sub-pixel 33 may all be a quadrangle or an octagon, or the first sub-pixel 11 and the third sub-pixel 33 may be an octagon, and the second sub-pixel 22 may be a quadrangle, etc., which may be determined according to actual design requirements. Specially, the sub-pixels are all diamond-shaped or square-shaped, and a symmetry axis of the shape of each sub-pixel may be the row direction or the column direction. In addition, the shape of the first sub-pixel 11 may include a right angle, a rounded chamfer, or a flat chamfer. Similarly, the shape of each of the second sub-pixel 22 and the third sub-pixel 33 may also include a right angle, a rounded chamfer, or a flat chamfer.

In practical application, the shapes of the sub-pixels may be flexibly set according to practical situations such as application occasions of the display panel and display effects required by customers. For example: each sub-pixel may be designed as being a quadrangle as shown in FIG. 2 or FIG. 4; or each sub-pixel may be designed as being an octagon (e.g., an octagon formed by cutting off four corners of the quadrangle) in consideration of a wiring for the display panel and the process for manufacturing the mask. Alternatively, other shapes are also possible, such as a hexagonal shape, a circular shape, a triangular shape, a pentagonal shape, etc.

According to the pixel array, the arrangement of the sub-pixels is changed, so that the aperture ratio of pixels is improved, the sub-pixels with elongated openings in the conventional technology are avoided, and the PPI is increased, thereby improving a physical resolution of a display apparatus including the pixel array; in addition, a size and pitch of the openings of the sub-pixels may also be set, to realize required display, so that a more uniform display may be realized.

The present disclosure further provides a fine metal mask for manufacturing the pixel array. The fine metal mask in the present disclosure may include a first sub-mask for forming first sub-pixel groups, a second sub-mask for forming second sub-pixel groups and a third sub-mask for forming third sub-pixel groups, the first sub-mask includes first sub-pixel group openings arranged in an array of rows and columns, the first sub-pixel group openings in adjacent rows are staggered in the row direction, and the first sub-pixel group openings in adjacent columns are staggered in the column direction; the second sub-mask includes second sub-pixel group openings arranged in an array of rows and columns, the second sub-pixel group openings in adjacent rows are staggered in the row direction, and the second sub-pixel group openings in adjacent columns are staggered in the column direction; the third sub-mask includes third group openings arranged in an array of rows and columns, the third sub-pixel group openings in adjacent rows are staggered in the row direction, and the third sub-pixel group openings in adjacent columns are staggered in the column direction.

Figure 5:
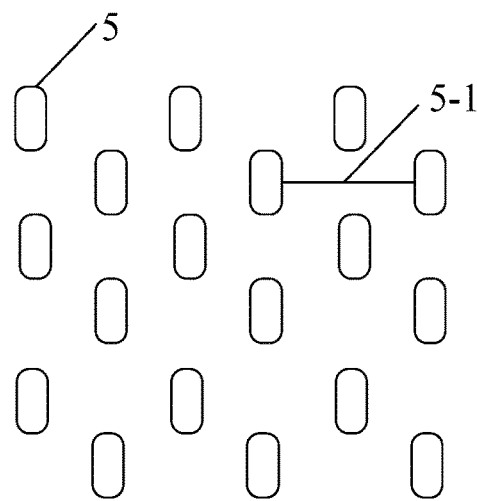
FIG. 5 shows a schematic diagram of a structure of a fine metal mask according to an embodiment of the present disclosure.
Figure 5:
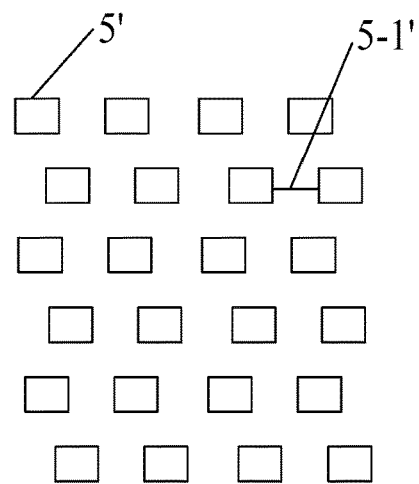
Figure 5:
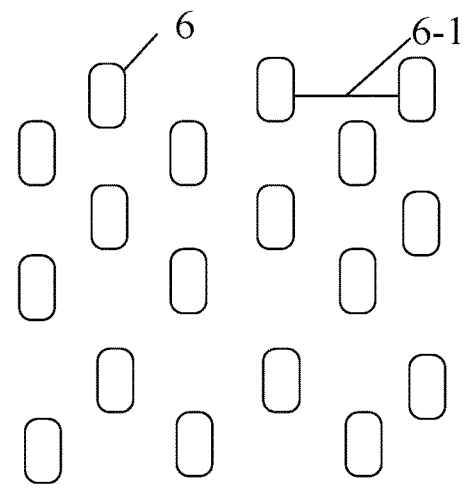
Figure 5:
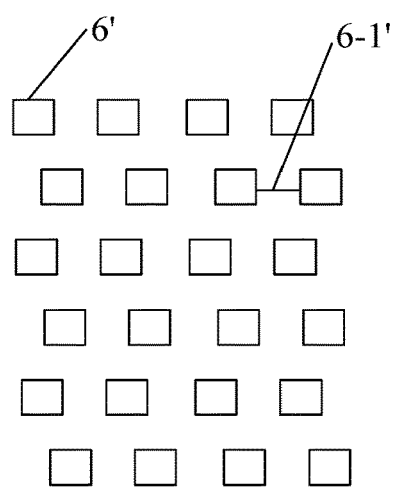
Figure 5:
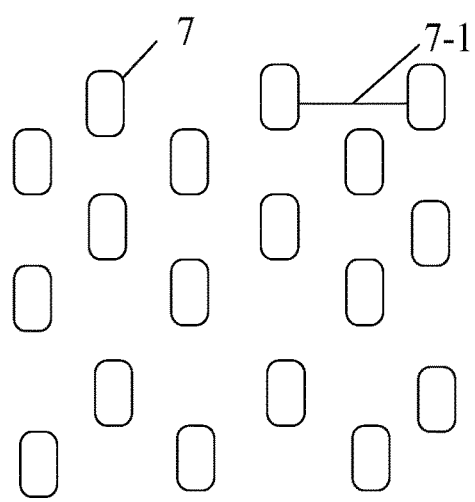
Figure 5:
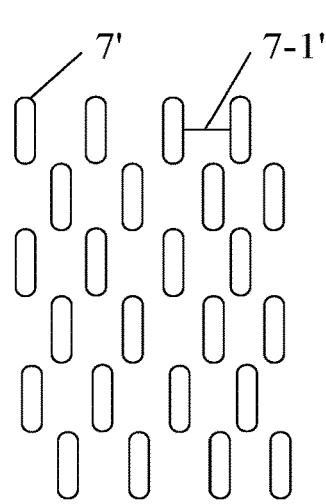

For example, as shown in FIG. 5, the fine metal mask (FFM) of the present disclosure includes a first sub-mask for forming a plurality of first sub-pixel groups, a second sub-mask for forming a plurality of second sub-pixel groups, and a third sub-mask for forming a plurality of third sub-pixel groups.

For example, as shown in FIG. 5, any one of the first sub-pixel group openings 5, the second sub-pixel group openings 6, and the third pixel group openings 7 is shaped as a quadrangle, and corners at edges of the quadrangle may include rounded or flat chamfers. For example, the quadrangle includes first and second sides extending in the column direction and opposite to each other, and third and fourth sides extending in the row direction and opposite to each other; straight lines or circular arcs are provided between the first side and the third side, between the first side and the fourth side, between the second side and the third side and between the second side and the fourth side, respectively.

As shown in FIG. 5(*a*) and FIG. 5(*b*), a width and a height of each opening 5 of the first sub-mask for forming the first sub-pixel groups 1 of the present disclosure shown in FIG. 5(*a*) are greater than those of each opening 5' of the mask of the corresponding color in the related art shown in FIG. 5(*b*), respectively; and a distance 5-1 between the two openings 5 of the first sub-mask of the present disclosure shown in FIG. 5(*a*) is much greater than a distance 5-1' between the two openings 5' of the mask of the corresponding color in the related art shown in FIG. 5(*b*).

Similarly, as shown in FIG. 5(*c*) and FIG. 5(*d*), a width and a height of each opening 6 of the second sub-mask for forming the second sub-pixel groups 2 of the present disclosure shown in FIG. 5(*c*) are greater than those of each opening 6' of the mask of the corresponding color in the related art shown in FIG. 5(*d*), respectively; and a distance 6-1 between the two openings 6 of the second sub-mask of the present disclosure shown in FIG. 5(*c*) is much greater than a distance 6-1' between the two openings 6' of the mask of the corresponding color in the related art shown in FIG. 5(*d*).

Similarly, as shown in FIG. 5(*e*) and FIG. 5(*f*), a width and a height of each opening 7 of the third sub-mask for forming the third sub-pixel groups 3 of the present disclosure shown in FIG. 5(*e*) are greater than those of each opening 7' of the mask of the corresponding color in the related art shown in FIG. 5(*f*), respectively; and the distance 7-1 between the two openings 7 of the first sub-mask of the present disclosure shown in FIG. 5(*e*) is much greater than a distance 7-1' between the two openings 7' of the mask of the corresponding color in the related art shown in FIG. 5(*f*).

In particular, when the third sub-pixel 33 is a blue sub-pixel, a width of each opening of the mask used for the blue sub-pixels of the present disclosure is increased compared to a fine metal mask (FMM) used for a stripe arrangement of the blue sub-pixels in the related art. When the pixel array of the present disclosure is used for an organic electroluminescent display apparatus, a sub-pixel pitch is increased, facilitating the FMM process. Therefore, the opening pitch of the mask for the red sub-pixels, the blue sub-pixels or the green sub-pixels is increased, so that the FMM design and the evaporation process for organic layers are facilitated, and the high resolution is realized more easily.

In the present disclosure, as shown in FIG. 5, the first sub-mask for forming the plurality of first sub-pixel groups 1 includes a plurality of openings 5, the second sub-mask for forming the plurality of second sub-pixel groups 2 includes a plurality of openings 6, and the third sub-mask for forming the plurality of third sub-pixel groups 3 includes a plurality of openings 7. First sub-pixels are formed on the substrate and at a position corresponding to each opening by using the first, second, and third sub-masks in cooperation with the pixel driving circuits T formed on the substrate to be independently driven for each sub-pixel and a pixel defining layer (PDL) defining a position of each sub-pixel, as shown in FIGS. 2 and 4.

In addition, the present disclosure further provides a display apparatus including a substrate and the above pixel array disposed on the substrate.

In one embodiment, such as shown in FIG. 4, the display apparatus may further include at least one spacer 4 disposed on the substrate; in the column direction, each spacer 4 of the at least one spacer is positioned between the first basic pixel unit 100 and the second basic pixel unit 200 in two adjacent rows. In an embodiment, an orthographic projection of the spacer 4 on the substrate may be polygonal, such as quadrangular, hexagonal, octagonal, circular, triangular, pentagonal, etc. The at least one spacer 4 is, for example, disposed on the pixel defining layer and used for isolating the metal mask during deposition of the organic light emitting layers, to prevent the metal mask from contacting the array substrate.

In the embodiment shown in FIG. 4, a plurality of spacers 4 are disposed on the substrate, for example, one spacer 4 is disposed at a position of each first basic pixel unit 100 or each second basic pixel unit 200, so that the entire display apparatus has a more stable structure and a smooth and steady configuration. The spacers 4 are respectively located between the first basic pixel units 100 and the second basic pixel units 200 in two adjacent rows.

For example, as shown in FIG. 4, in this embodiment, the plurality of first basic pixel units 100 and the plurality of second basic pixel units 200 are aligned in the column direction Y, and in the first basic pixel units 100 and the second basic pixel units 200 in two adjacent rows and in the same column, an outer edge of the first sub-pixel 11 of each first basic pixel unit 100 is aligned in the column direction with an outer edge of the third sub-pixel 33 of the corresponding second basic pixel unit 200. For the pixel array having this structure, the spacers 4 in the display apparatus may be arranged in an array and in rows and columns. For example, the orthographic projection of each spacer 4 on the substrate is rectangular, one side of which may form an acute angle with the row direction, for example between 30 and 60 degrees; the spacers 4 in two adjacent rows are arranged mirror-symmetrically with respect to the first basic pixel unit 100 or the second basic pixel unit 200 between the spacers 4 in two adjacent rows. For example, the spacers 4 in the second row and in the third row are arranged mirror-symmetrically with respect to the second basic pixel unit 200 in the second row, so that the entire display apparatus has a more balanced and stable structure. Extending lines L1 and L2 of two adjacent spacers in the same column of spacers intersects with each other at a point.

The spacers 4 in the present disclosure are provided at positions corresponding to the openings of the first sub-mask, the second sub-mask and the third sub-mask included in the fine metal mask for manufacturing the organic light emitting layers, so that when the organic light emitting layers are formed by evaporation, the openings of the mask bypass the spacers, thereby avoiding unnecessary rubbing, and avoiding causing foreign matter badness.

The display apparatus of the present disclosure may be: any product or component with a display function, such as a liquid crystal panel, an electronic paper, an OLED panel, a mobile phone, a tablet computer, a television, a display, a notebook computer, a digital photo frame, a navigator or the like.

The display apparatus has a higher yield because the pixel structure of the display apparatus is very favorable for the evaporation process of the organic layers. Moreover, the display apparatus has a better display effect because the pixel structure of the display apparatus has higher brightness and color uniformity.

According to the pixel array and the display apparatus, through the improvement of the pixel arrangement, the aperture ratio of the sub-pixels of each color is improved, the influence on color shift of different viewing angles caused by too narrow pixel openings in the related art is avoided, and therefore the physical pixel resolution and the color uniformity of the display apparatus are improved. The pixel structure can also realize real-time display, a complex borrowing algorithm for sub-pixel rendering is not needed, the display effect of the display apparatus is improved, and the problem in the prior art that the resolution of the display apparatus (especially, an organic light emitting display apparatus) is difficult to be improved due to process issues is solved.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A pixel array, comprising a plurality of first basic pixel units arranged in odd-numbered rows and a plurality of second basic pixel units arranged in even-numbered rows; wherein each of the first basic pixel units comprises a first sub-pixel group, a second sub-pixel group, and a third sub-pixel group arranged sequentially in a row direction; each of the second basic pixel units comprises the third sub-pixel group, the first sub-pixel group, and the second sub-pixel group arranged sequentially in the row direction; the first sub-pixel group comprises two first sub-pixels arranged in a column direction; the second sub-pixel group comprises two second sub-pixels arranged in the column direction; the third sub-pixel group comprises two third sub-pixels arranged in the column direction; the first sub-pixel, the second sub-pixel and the third sub-pixel have different colors; wherein the first basic pixel units in the even-numbered rows are aligned in the column direction;
the second basic pixel units in the odd-numbered rows are aligned in the column direction;
light emitting layers of the two first sub-pixels in the first sub-pixel group are continuous, light emitting layers of the two second sub-pixels in the second sub-pixel group are continuous, and light emitting layers of the two third sub-pixels in the third sub-pixel group are continuous; and there is a distance D, in the row direction, between a boundary of the first sub-pixel group away from the second sub-pixel group in the first basic pixel unit and a boundary of the third sub-pixel group away from the first sub-pixel group in the second basic pixel unit closest to the first basic pixel unit in an adjacent row; the distance D is greater than or equal to zero and less than or equal to a sum of a width of the first sub-pixel group in the row direction, a width of the second sub-pixel group in the row direction and a distance between the first sub-pixel group and the second sub-pixel group in the row direction.

2. The pixel array according to claim 1, wherein the first sub-pixel group comprises two first pixel driving circuits for driving the two first sub-pixels in the first pixel group to emit light, respectively;
the second sub-pixel group comprises two second pixel driving circuits for driving the two second sub-pixels in the second pixel group to emit light, respectively; and
the third sub-pixel group comprises two third pixel driving circuits for driving the two third sub-pixels in the third pixel group to emit light, respectively.

3. The pixel array according to claim 2, wherein in the first basic pixel unit and the second basic pixel unit closest to each other in two adjacent rows, in the row direction, the third sub-pixel group in one row at least partially overlap the first sub-pixel group or the second sub-pixel group in the other row; or in the row direction, the third sub-pixel group in one row is located between the first sub-pixel group and the second sub-pixel group in the other row.

4. The pixel array according to claim 3, wherein in the first basic pixel unit or the second basic pixel unit,
the two first sub-pixels in the first sub-pixel group, the two second sub-pixels in the second sub-pixel group, and the two third sub-pixels in the third sub-pixel group are arranged in two rows and three columns, and
a height of the first sub-pixel in the column direction, a height of the second sub-pixel in the column direction and a height of the third sub-pixel in the column direction are equal to each other.

5. The pixel array according to claim 4, wherein
a width of the first sub-pixel in the row direction is less than that of the second sub-pixel in the row direction, and
a width of the second sub-pixel in the row direction is less than that of the third sub-pixel in the row direction.

6. The pixel array according to claim 5, wherein
the second sub-pixel constitutes one basic display unit together with a corresponding first sub-pixel and a corresponding third sub-pixel closest to the second sub-pixel in an adjacent row such that the plurality of first basic pixel units and the plurality of second basic pixel units constitute a plurality of basic display units.

7. The pixel array according to claim 6, wherein
the first sub-pixel is a red sub-pixel, the second sub-pixel is a green sub-pixel, and the third sub-pixel is a blue sub-pixel; and
a light emitting center of the basic display unit constituted by the first sub-pixel, the second sub-pixel and the third sub-pixel is on a line connecting a center of the red sub-pixel and a center of the green sub-pixel at a position close to the green sub-pixel.

8. The pixel array according to claim 7, wherein
the plurality of basic display units are arranged in rows and columns; and
a distance between light emitting centers of any two adjacent basic display units in any one row in the plurality of rows of basic display units is constant.

9. The pixel array according to claim 8, wherein
in any adjacent three basic display units in any one column in the plurality of columns of basic display units, the any adjacent three basic display units comprise a first basic display unit, a second basic display unit, and a third basic display unit arranged sequentially in the column direction, and a distance between light emitting centers of the first and second basic display units is different from that between light emitting centers of the second and third basic display units.

10. The pixel array according to claim 9, wherein
in the row direction, a center of the third sub-pixel group in each second basic pixel unit in the even-numbered row is at a midpoint of a line connecting centers of the first sub-pixel group and the second sub-pixel group in the first basic pixel unit closest to the third sub-pixel group in the odd-numbered row adjacent to the even-numbered row;
in the row direction, a center of the second sub-pixel group in each second basic pixel unit in the even-numbered row is at a midpoint of a line connecting centers of the second sub-pixel group and the third sub-pixel group in the first basic pixel unit closest to the second sub-pixel group in the odd-numbered row adjacent to the even-numbered row; and
in the row direction, a center of the first sub-pixel group in each second basic pixel unit in the even-numbered row is at a midpoint of a line connecting centers of the second sub-pixel group and the third sub-pixel group in the first basic pixel unit closest to the first sub-pixel group in the odd-numbered row adjacent to the even-numbered row.

11. The pixel array according to claim 10, wherein
a perpendicular bisector of a line connecting centers of two adjacent first sub-pixels in the row direction in a same row extends through a plurality of first sub-pixels in a same column;
a perpendicular bisector of a line connecting centers of two adjacent second sub-pixels in the row direction in a same row extends through a plurality of second sub-pixels in a same column; and
a perpendicular bisector of a line connecting centers of two adjacent third sub-pixels in the row direction in a same row extends through a plurality of third sub-pixels in a same column.

12. The pixel array according to claim 1, wherein each of the first sub-pixel, the second sub-pixel and the third sub-pixel is quadrangular or polygonal;
an edge of any one first sub-pixel away from the other first sub-pixel in the two first sub-pixels in the first sub-pixel group comprises at least one rounded chamfer or flat chamfer;
an edge of any one second sub-pixel away from the other second sub-pixel in the two second sub-pixels in the second sub-pixel group comprises at least one rounded chamfer or flat chamfer; and/or
an edge of any one third sub-pixel away from the other third sub-pixel in the two third sub-pixels in the third sub-pixel group comprises at least one rounded chamfer or flat chamfer.

13. A display apparatus, comprising a substrate and the pixel array according to claim 1 on the substrate.

14. The display apparatus according to claim 13, wherein
the display apparatus further comprises at least one spacer on the substrate; and
in the column direction, each spacer of the at least one spacer is between the first basic pixel unit and the second basic pixel unit in two adjacent rows.

15. The display apparatus according to claim 14, wherein an orthographic projection of the spacer on the substrate is rectangular or polygonal.

16. The display apparatus according to claim 14, wherein
in the row direction, the third sub-pixel group in the second basic pixel unit in the even-numbered row is between the first sub-pixel group and the second sub-pixel group in the first basic pixel unit in the odd-numbered row adjacent to the even-numbered row;
in the row direction, the second sub-pixel group in the second basic pixel unit in the even-numbered row is between the first sub-pixel group and the third sub-pixel group in the first basic pixel unit in the odd-numbered row adjacent to the even-numbered row;
in the row direction, the first sub-pixel group in the second basic pixel unit in the even-numbered row is between the second sub-pixel group and the third sub-pixel group in the first basic pixel unit in the odd-numbered row adjacent to the even-numbered row; and
the spacer is among the first sub-pixel group and the second sub-pixel group in the first basic pixel unit, and the third sub-pixel group in the second basic pixel unit closest to the first sub-pixel group and the second sub-pixel group in the first basic pixel unit in an adjacent row.

17. The display apparatus according to claim 16, wherein
a perpendicular bisector of a line connecting centers of two adjacent first sub-pixels in the row direction in a same row extends through a plurality of first sub-pixels in a same column;
a perpendicular bisector of a line connecting centers of two adjacent second sub-pixels in the row direction in a same row extends through a plurality of second sub-pixels in a same column; and
a perpendicular bisector of a line connecting centers of two adjacent third sub-pixels in the row direction in a same row extends through a plurality of third sub-pixels in the same column.

18. The display apparatus according to claim 14, wherein
the distance D is equal to zero;
the at least one spacer comprises a plurality of spacers; and
the plurality of spacers are arranged in an array of rows and columns.

19. The display apparatus according to claim 18, wherein
an orthographic projection of the at least one spacer on the substrate is rectangular or polygonal;
one side of each of the plurality of spacers forms an acute angle with the row direction; and
spacers in two adjacent rows are arranged mirror-symmetrically with respect to the first basic pixel unit or the second basic pixel unit in one row between the two adjacent rows.

20. The display apparatus according to claim 19, wherein extending lines of two adjacent spacers in a same column intersect with each other.

* * * * *